United States Patent [19]
Heubi

[11] Patent Number: 6,016,115
[45] Date of Patent: Jan. 18, 2000

[54] RECIRCULATING A/D OR D/A CONVERTER WITH SINGLE REFERENCE VOLTAGE

[75] Inventor: Alexandre Heubi, La Chaux-de-fonds, Switzerland

[73] Assignee: Soprintel S.A., La Chaux-de-fonds, Switzerland

[21] Appl. No.: 09/032,565

[22] Filed: Feb. 27, 1998

Related U.S. Application Data

[63] Continuation of application No. PCT/WO97/08835, Aug. 26, 1996.

[30] Foreign Application Priority Data

Aug. 29, 1995 [FR] France .................................... 95 10174

[51] Int. Cl.[7] ........................................................ H03M 1/38
[52] U.S. Cl. .......................................... 341/161; 341/172
[58] Field of Search ..................................... 341/110, 161, 341/162, 163, 172, 150

[56] References Cited

U.S. PATENT DOCUMENTS

| | | | |
|---|---|---|---|
| 4,692,738 | 9/1987 | Suzuki | 341/110 |
| 4,743,885 | 5/1988 | Kobayahsi | 341/150 |
| 5,212,486 | 5/1993 | Nagaraj | 341/172 |
| 5,510,789 | 4/1996 | Lee | 341/163 |

FOREIGN PATENT DOCUMENTS

| | | |
|---|---|---|
| 0213954 | 9/1986 | European Pat. Off. . |
| 0214831 | 9/1986 | European Pat. Off. . |
| 0251758 | 6/1987 | European Pat. Off. . |
| 2223137 | 9/1989 | United Kingdom . |

*Primary Examiner*—Howard L. Williams

[57] ABSTRACT

The converter has a three decision range conversion algorithm using ternary values. The converter has a single unipolar reference voltage source (Vr) and computing method (MC) to establish a voltage value. The voltage value is determined by determining a sum value from the voltage calculated during the previous iteration, and a value which is the product of the ternary value during the preceding iteration and the reference voltage. Computing is by switched capacitors (Cr, C1, C2) connected to a single operational amplifier (11). This provides a more compact circuit with less surface integration having a smaller current requirement whilst having a good conversion quality for applications such as hearing aids.

10 Claims, 5 Drawing Sheets

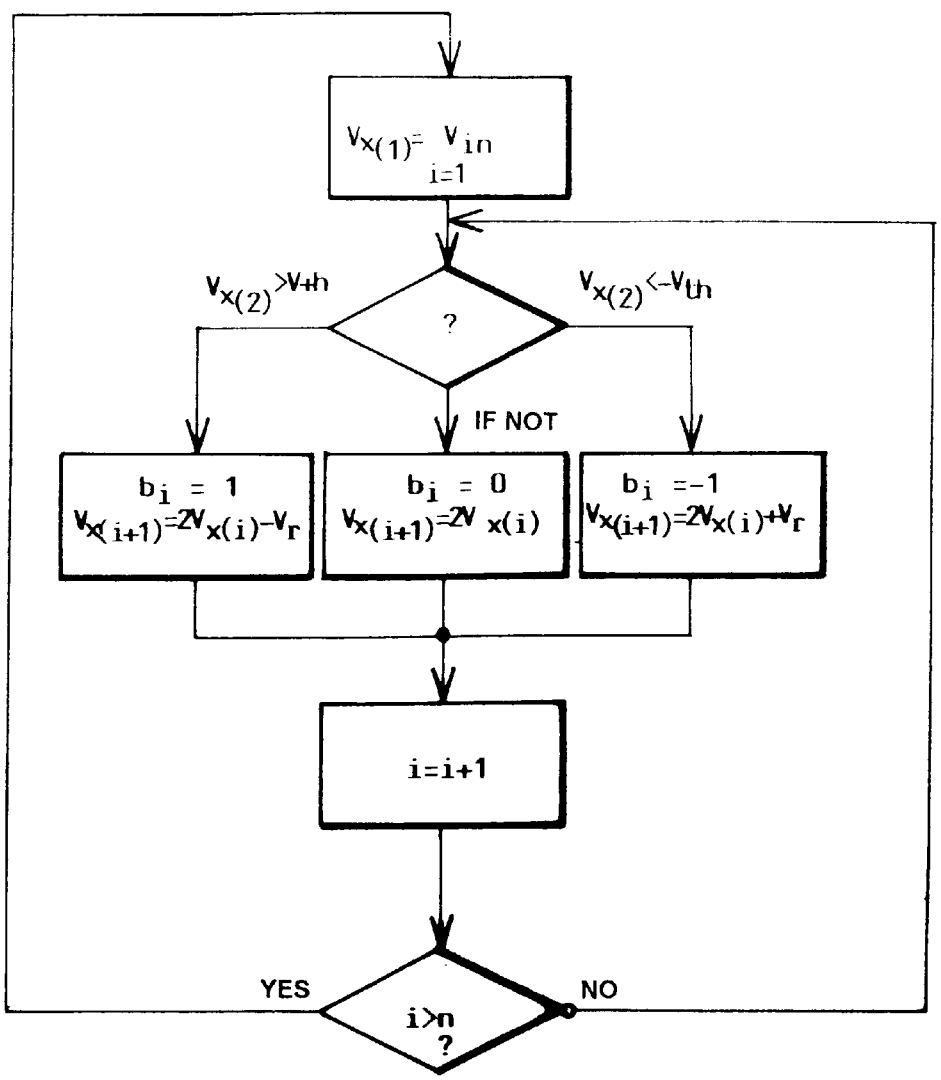
FIG.:1
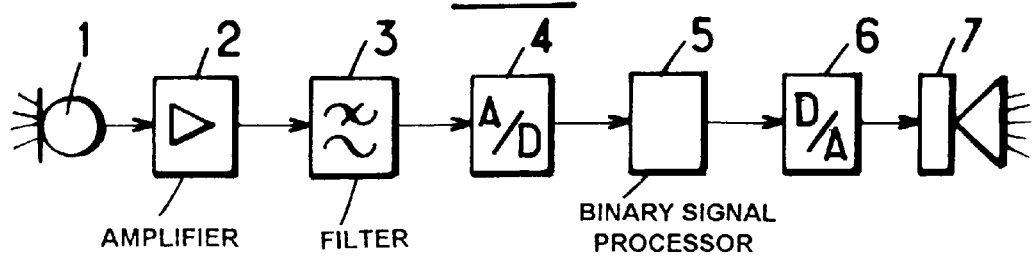
FIG.:2

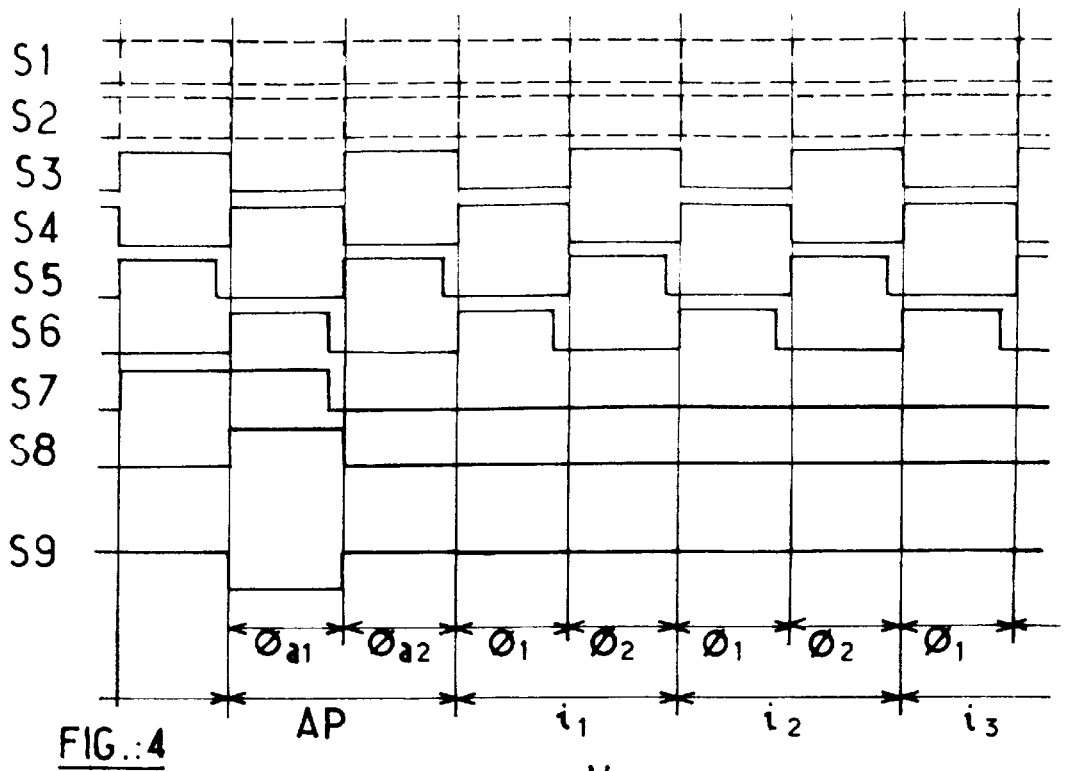
FIG.:4
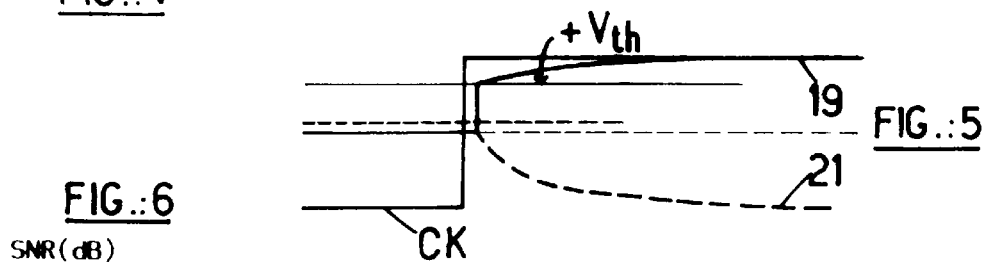
FIG.:5
FIG.:6
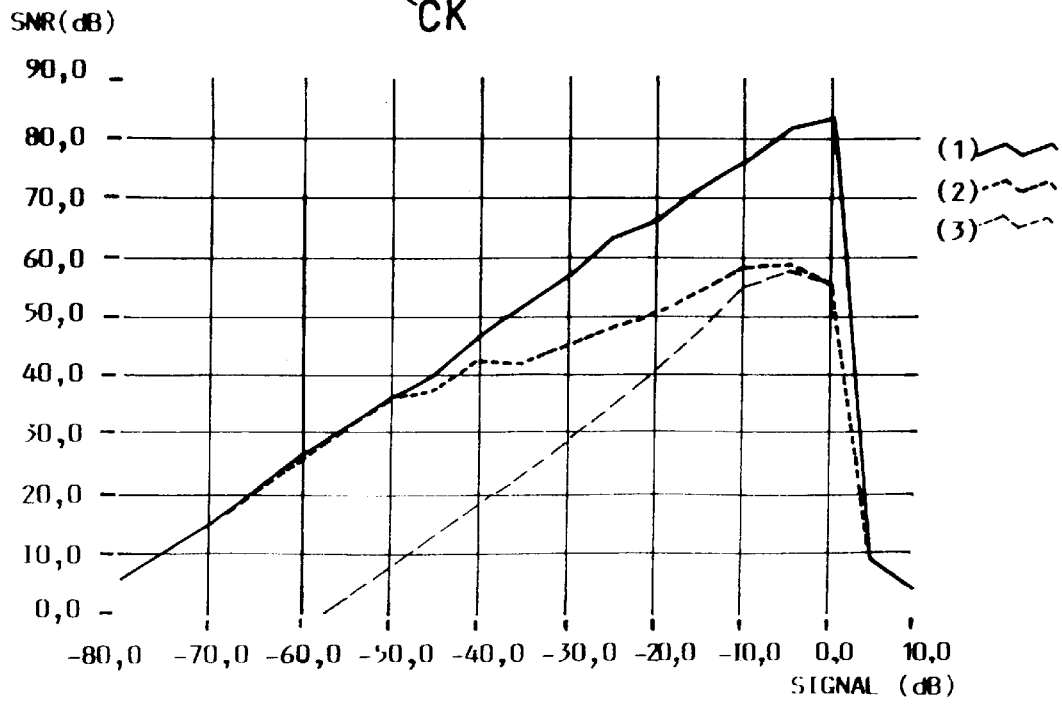

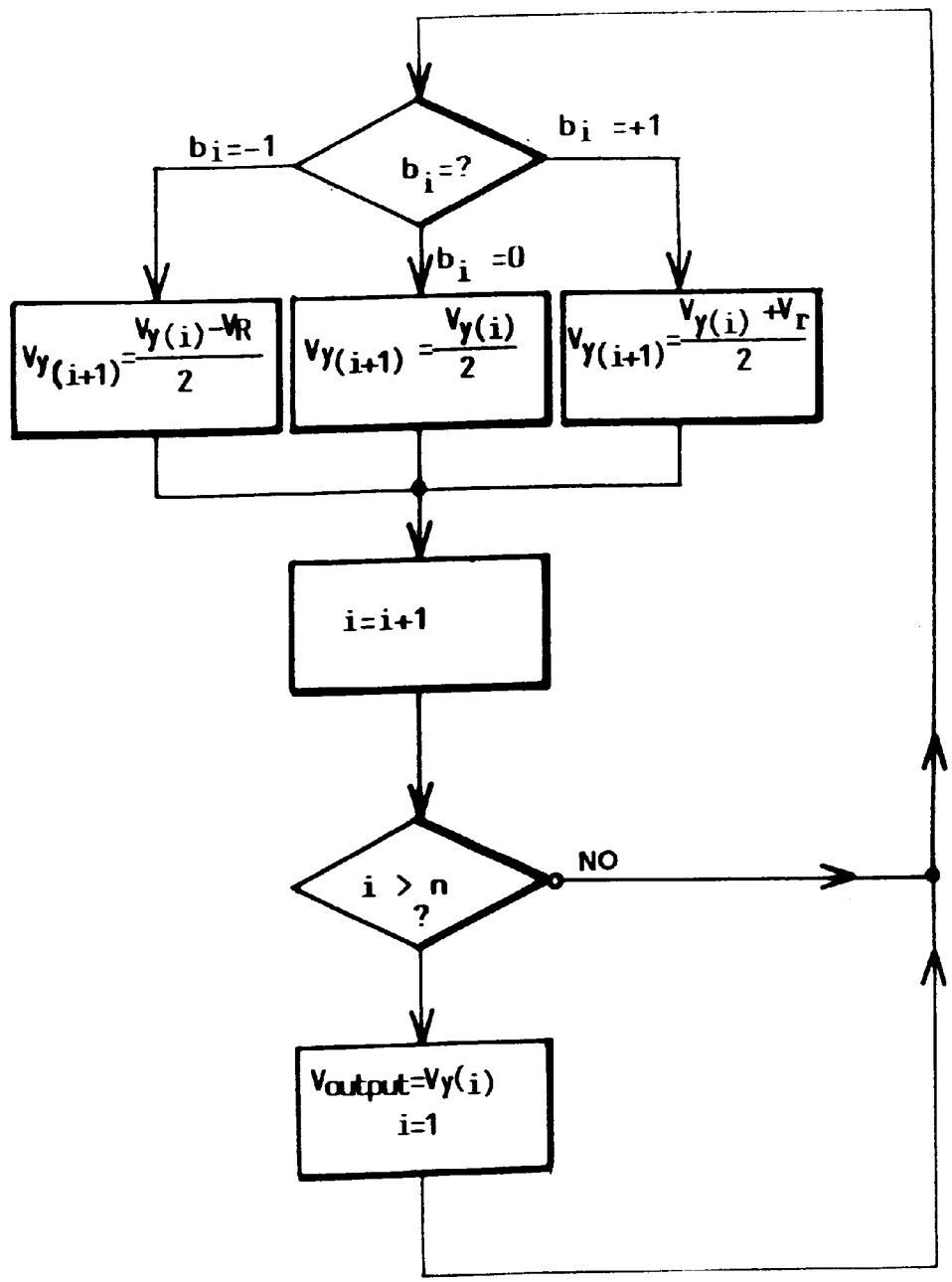
FIG.: 7

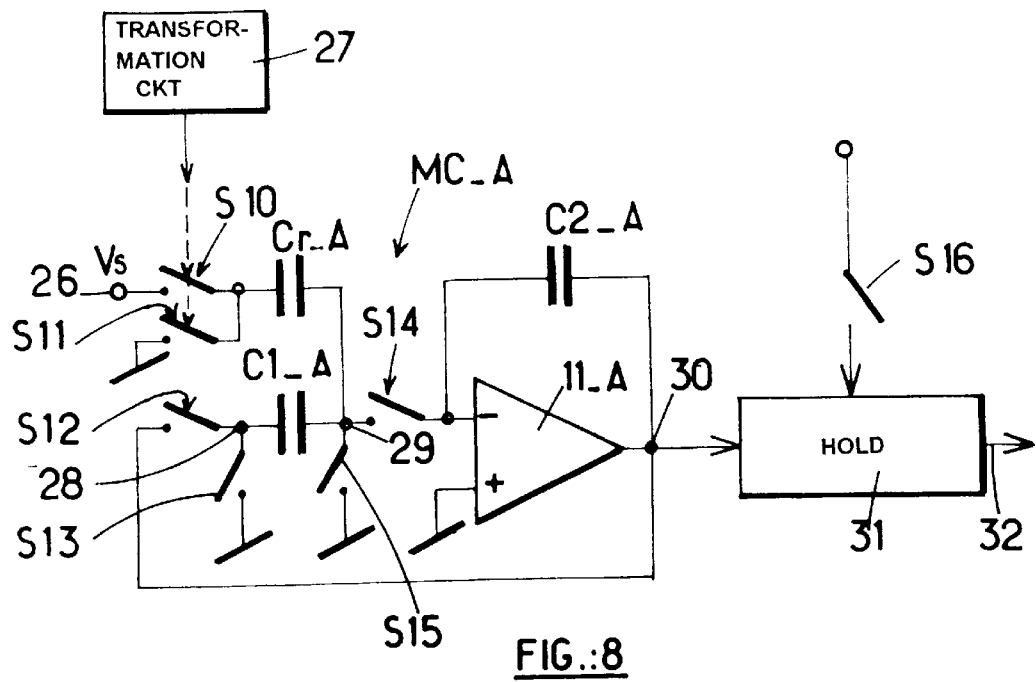
FIG.:8
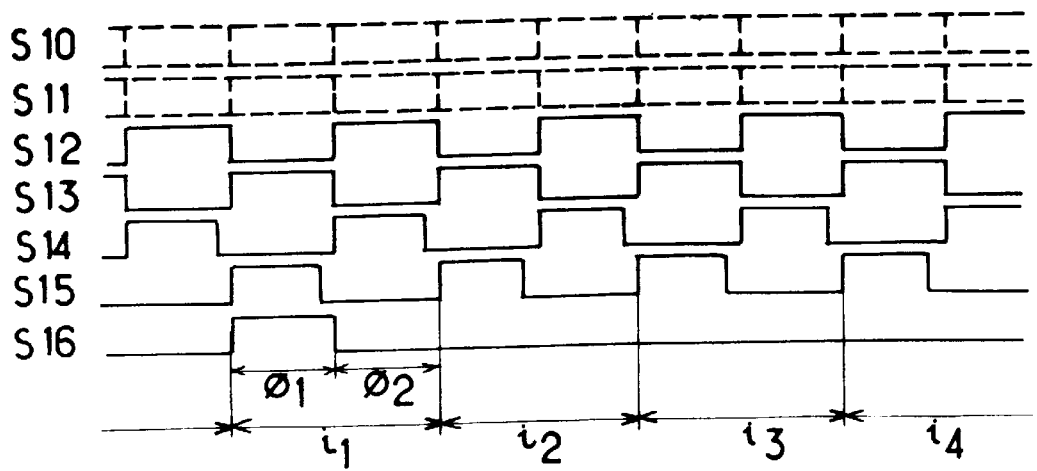
FIG.:9

RECIRCULATING A/D OR D/A CONVERTER WITH SINGLE REFERENCE VOLTAGE

This application is a continuation of International Application No. PCT WO97/08835 filed Aug. 26, 1996.

BACKGROUND OF THE INVENTION

The present invention relates to a device for the digital processing of an information item presented in an analogue form and required to be restored in an analogue form after having undergone this digital processing.

More precisely, the invention relates to a converter intended to realise a conversion of variable signals, either in the analogue/digital direction, or in the digital/analogue direction, these signals being required to be used in applications in which their conversion does not necessitate a uniform absolute precision over the whole of their range of variation.

An application in which conversions of this type are acceptable is that of a hearing aid with which the hearing-impaired are fitted.

These apparatuses require, in particular, adaptation of the surrounding sound spectrum to the physiology of the ear of the wearer, hence the presence in these apparatuses of means for processing the signals received before they can be transmitted to the ear by way of a sound transducer for restoring sounds. Since the processing is relatively complex and advantageously is often tailored to each patient, it is desirable for it to be done on digital rather than analogue signals. It is in fact under these conditions that it can be executed by specially adapted software which can be easily configured from case to case. Such a hearing aid must thus be able to convert the useful signals in both directions, namely analogue/digital and the reverse direction.

Numerous experiments have shown that the quality of the auditory perception can accommodate a noise level reaching 30 dB with respect to the useful signal. As a consequence, it transpires that a relative conversion precision with respect to the useful signal is sufficient in this particular application.

In other words, at the digital level a much lower precision would be needed than that commonly accepted for the conversion of analogue sound signals (customarily 14 bits absolute) in commonly used sound installations.

DESCRIPTION OF THE PRIOR ART

This relative precision can be obtained by using a so-called "three decision range" converter. A converter of this type in the analogue/digital direction is described in an article by Bernard Ginetti et al., published in the journal "IEEE Journal of Solid-State Circuits", Vol. 27, No. 7, July 1992.

This article firstly describes the algorithm implemented in such a converter. This algorithm is recalled here while referring to FIG. 1 of the appended drawings in which the following notation is used:

i=iteration number in the algorithm;
$b_i$=binary value obtained in each iteration;
$V_{in}$=voltage to be converted;
$V_{x_{(i)}}$=instantaneous value of $V_{in}$;
$V_{x_{(i)}}$=intermediate voltage of the algorithm;
$V_r$=reference voltage;
$V_{th}$=threshold voltage;
n=total number of iterations for one sample extraction.

In principle, this cyclic conversion algorithm amounts to the following procedure. Each sample $V_{x_{(1)}}$ of the input voltage $V_{in}$ to be converted is multiplied by two and the result of this multiplication is compared with a reference voltage. If the signal is larger than this reference voltage, the most significant bit of the output signal is set to "1" and the reference voltage is subtracted from $V_{x_{(1)}}$. Otherwise, the most significant bit is set to "0" and no arithmetic operation is executed. The remainder of the voltage, $V_{x_{(2)}}$, which corresponds in fact to the partial remainder of the division, undergoes the same operations in the course of the next iteration and the loop of the algorithm is repeated in this way until the least significant bit is obtained.

In fact, to obtain better conversion performance, especially with regard to clock frequency and simplification of the components required, this procedure is supplemented with the determining of a third value of b, by using two comparison levels, $+V_{th}$ and $-V_{th}$, at each iteration. Thus, if the signal $V_x$ is greater than $+V_{th}$, the output bit is set to "1" and the reference voltage is subtracted. If the signal $V_x$ is smaller than $-V_{th}$, the bit is set to $-1$ and the voltage $V_{th}$ is added. In the other cases, the bit is set to "0" and no arithmetic operation is performed.

In the cited article, the main concern is to propose a circuit for implementing this algorithm with the objective of reducing the minimum precision required by the comparison between $\pm V_r$ and the 0 voltage and the loop offset error. This attempt of the authors of the article leads to a circuit whose performance is excellent but which, in certain applications, and especially that of hearing apparatuses, exceeds the required demands with regard to the precision of the conversion. In integrated form, such a circuit is therefore excessively bulky and an excessively large consumer of energy in relation to the objective sought.

The invention is based on the consideration that in certain applications and especially in that of hearing apparatuses, but also certain other fields such as "audiometry" (the technique of measuring hearing of a radio or television station) or else telephony, a relatively sizeable signal/noise ratio can be accepted, as already indicated above, this making it possible in the implementation of the algorithm of FIG. 1 to use a simpler circuit requiring less integration area, exhibiting lower consumption but nevertheless being compatible with the conversion qualities which are to be expected in the specific application envisaged, such as for example a hearing aid.

SUMMARY OF THE INVENTION

The objective of the invention is to provide a signal converter which is simple, not bulky and of greatly restricted consumption.

The subject of the invention is therefore a converter of an input signal into an output signal representing the said input signal with a relative precision, this converter implementing a conversion algorithm with three decision ranges involving ternary digital values $b_i$ with $b_i$ 1, 0, or $-1$, and comprising a reference voltage source, means of computation for, in the course of each of the iterations of a sequence of successive iterations of the said algorithm, determining a voltage value formed by the sum of a value determined on the basis of the voltage computed in the previous iteration and of a value which is the product of the ternary value obtained in the course of the previous iteration and of the said reference voltage, the said means of computation comprising for this purpose a plurality of switched capacitances cooperating with amplification means delivering the said voltage value in each of the said iterations, the said converter also comprising generator means for producing, from the successive voltage values computed during the said sequence of iterations, successive samples representing, in converted form, the said input signal, characterized in that the said means of computation are formed by a unilateral arrangement of switched capacitances in combination with a single operational amplifier forming the said amplification means, one of the inputs of the said operational amplifier being connected to a fixed potential, and in that the said reference source is devised so as to provide a unipolar reference voltage referenced to the said fixed potential.

According to a first embodiment of the invention, in which the said input signals are analogue and the said output signals are digital, the said means of computation perform, in the course of each of the said iterations, the algorithm of the form $$V_{x_{i+1}} = 2V_{x_i} - b_i V_r$$

in which $V_{x_i}$ is the voltage obtained in the course of the previous iteration i, $V_{x_{i+1}}$ is the voltage to be obtained in the course of the iteration i+1 in progress, $b_i$ is the computed ternary value −1, 0 or +1 and $V_r$ is the reference voltage, and it also comprises comparison means for comparing the output signal from the said operational amplifier with a bipolar reference voltage and a transformation logic circuit for transforming the output from the said comparison means into the ternary values used in each iteration.

An analogue/digital converter exhibiting the characteristics set forth above requires only a single easily obtainable unipolar reference voltage, contrary to an arrangement in which one reference voltage would be needed for each polarity, the absolute values of which it would only be possible to determine by means of a complex matching circuit.

Moreover, since the arrangement is unilateral, a single operational amplifier is sufficient in order to realise the means of computation. This leads to an appreciable simplification of the converter and considerably reduces its consumption, this being a very useful property in portable apparatuses which are necessarily miniaturized, such as hearing aids in which the space reserved for the energy source is generally very restricted.

The cited article teaches only the realisation of an analogue/digital converter implementing the aforesaid algorithm by means of a symmetrical arrangement comprising several operational amplifiers.

However, the Applicant for the present patent application has found that the conversion algorithm with three decision ranges can, by means of appropriate adaptation, be used profitably to operate a reverse digital/analogue conversion, under the same conditions as those under which the converter according to the first embodiment of the invention works.

Thus, according to a second embodiment of the invention, in which the said input signals are digital and the said output signals are analogue, the said means of computation perform, in the course of each of the said iterations, the algorithm of the form $$V_{y_{(i+1)}} = \frac{(V_{y_{(i)}} + b_i V_s)}{2}$$

in which $V_{y_{(i)}}$ is the intermediate voltage portion computed in the course of the previous iteration i, $V_{y_{(i+1)}}$ is the intermediate voltage portion to be obtained during the iteration i+1 in progress, $b_i$ is the computed ternary value −1, 0 or +1 and $V_s$ is the reference voltage, and it also comprises holding means for retaining the cumulated voltage obtained in the course of a cycle of previous iterations during the execution of a cycle of iterations until the latter is completed so as to deliver the successive samples of the analogue voltage to be obtained.

This digital/analogue converter exhibits the same advantages of simplicity and low consumption as the converter according to the first embodiment.

The subject of the invention is also an electronic device, especially a hearing aid, comprising means for the digital processing of analogue signals required to be restored in an adapted and likewise analogue form after this processing and in combination with signal converters such as defined above.

BRIEF DESCRIPTION OF THE DRAWINGS

Other characteristics and advantages of the invention will emerge in the course of the description which follows, given merely by way of example and made with reference to the appended drawings in which:

FIG. 1 already described is the representation of a known algorithm used in the analogue/digital converter according to the invention;

FIG. 2 is a very simplified diagram of a hearing aid including two converters, one of each type, according to the invention;

FIG. 4 is a time chart illustrating the operation of the converter according to FIG. 3;

FIG. 5 is a graph illustrating the operation of the comparators used in the converter of FIG. 3;

FIG. 6 is a graph showing, as a function of the voltage applied to the converter, the evolution of the signal/noise ratio via several curves obtained with different methods of conversion;

FIG. 7 represents the flow chart implemented by the means of computation of the digital/analogue converter in accordance with the invention;

FIG. 8 is a simplified diagram of the means of computation of the digital/analogue converter according to the invention; and FIG. 9 is a time chart illustrating the operation of the converter according to FIG. 8.

Figure 3:
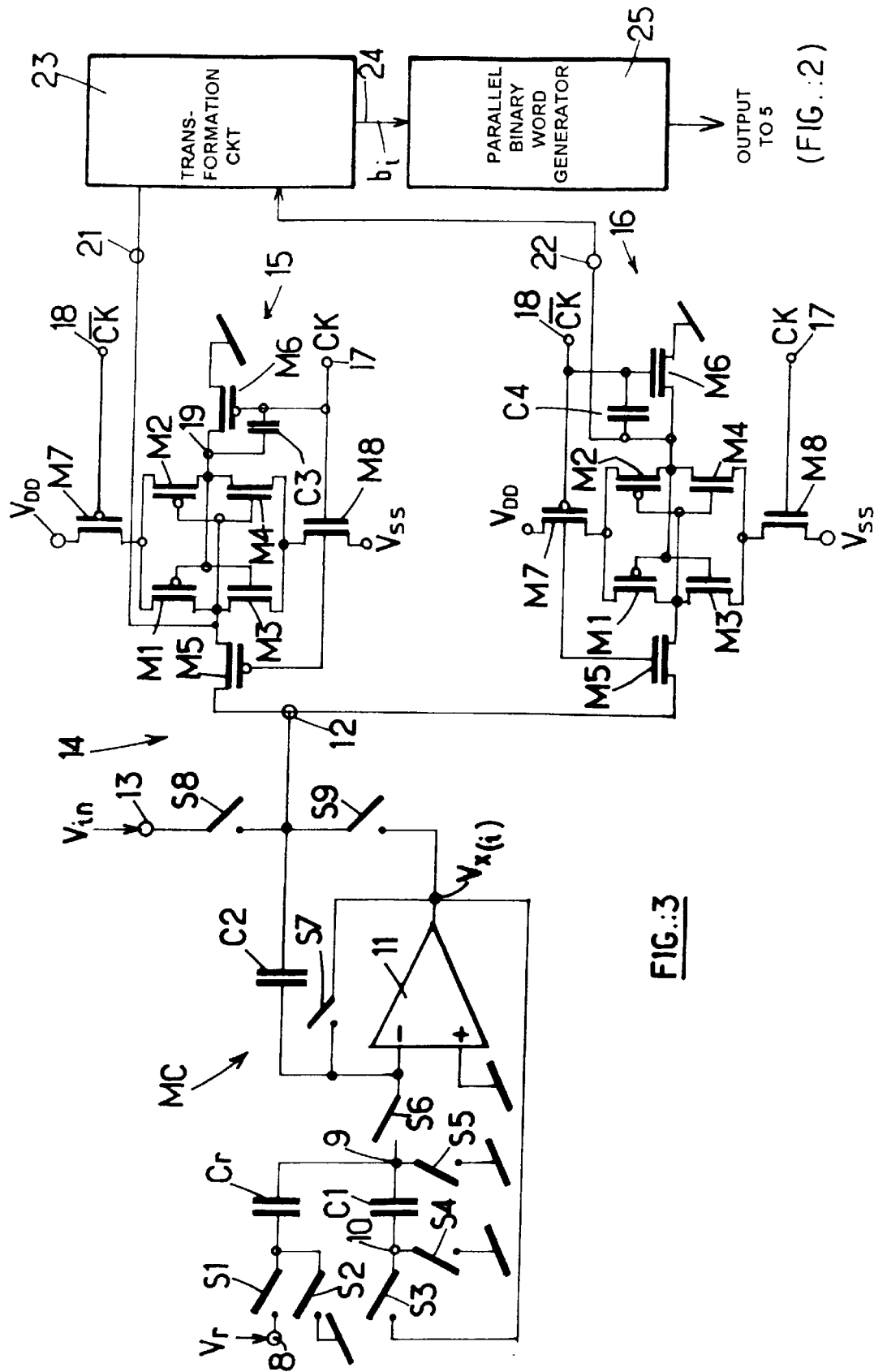
FIG. 3 is a more detailed diagram of the analogue/digital converter according to the invention.

Represented in FIG. 2 by way of example of an advantageous application of the invention is a preferred embodiment of a hearing aid in which two converters are used.

This hearing aid comprises a microphone 1 picking up the surrounding sound, a fixed-gain amplifier 2 receiving the signals from the microphone 1 and transmitting this amplified signal to a low-pass filter 3 having a cut-off frequency of 8,000 Hz, for example. The filtered signal from the filter 3 is applied to an analogue/digital converter 4 designed according to the invention and intended to produce, from this signal, a sequence of binary words coded in accordance with the value of the successive samples extracted from this analogue signal.

The output from the converter 4 is applied to a binary signal processor 5 which is intended to process the sound spectrum represented by the binary signals, especially to adapt it to the physiology of the ear of the wearer of the hearing aid.

The processor 5 is followed by another digital/analogue converter 6 according to the invention and this converter is wired to the output of the processor 5 in order to reconvert the binary signal transformed by the latter into an analogue signal. This signal is made audible by a loudspeaker 7 or any other suitable listening transducer, for the patient wearing the hearing aid.

The analogue/digital converter 4 according to the invention will now be described whilst referring to FIG. 3 which represents a preferred example thereof. This example is advantageously realised with so-called "switched capacitance" capacitors integrated on one and the same chip with MOS transistors which form controlled switches.

Thus, this converter comprises means of computation designated overall by the label MC and comprising a first reference capacitor Cr connected to a terminal 8 of the converter 4, to which terminal a DC reference voltage $V_r$, for example the supply voltage for the arrangement, is applied via a switch S1. It will be noted that this voltage $V_r$ is unipolar and the only voltage used for the computation. The capacitor Cr can also be connected selectively to earth via a switch S2. The other plate of the reference capacitor Cr is linked to a node 9 to which a capacitor C1 is linked. The opposite plate of this capacitor C1 is linked to a node 10 which is connected to two switches S3 and S4. The switch S4 is connected to earth.

The node 9 is linked to two switches S5 and S6, the switch S5 being also connected to earth. The switch S6 is connected to the inverting input of an operational amplifier 11, the non-inverting input of which is linked to earth, that is to say to a fixed potential. It will be observed that this amplifier is the only one used to perform the computation by the algorithm.

A capacitor C2 is wired between the inverting input of this amplifier 11 and a node 12. The output of the amplifier 11 is connected on the one hand to the switch S3 and on the other hand to a switch S7 which can link this output to the inverting input. Moreover, the node 12 is linked to a switch S8 enabling a voltage $V_{in}$, provided from a terminal 13, to be applied to the capacitor C2. A switch S9 is inserted between the capacitor C2 and the output of the amplifier 11. The node 12 is also connected to a comparator assembly designated overall by reference numeral 14.

It will be noted at this juncture that the means of computation MC are of a "unilateral" design which, within the meaning of the present description, implies that all the components work with polarities lying on one side of a base voltage, here earth, the polarity being chosen arbitrarily on the positive side. This results in a very simple circuit which, at the cost of an acceptable imprecision, makes it possible to obtain a conversion suitable to the application envisaged. It will also be noted that this arrangement includes only a single operational amplifier 11. Finally, the reference voltage $V_r$ is unipolar (and positive in the case represented).

The comparator assembly 14 comprises two comparators 15 and 16 whose diagrams are identical to within one exception. More precisely, each comparator comprises two inverters (transistors M1 to M4), which are cross-coupled, and to which are respectively connected two transistors M5 and M6 for transferring the signals to be compared and two transistors M7 and M8 for transferring the supply potentials $V_{ss}$ and $V_{dd}$. The voltages to be compared are, naturally that of the node 12 and respective threshold voltages $+V_{th}$ and $-V_{th}$ which, according to an important characteristic of the invention, are derived from a single potential, namely that of the earth. The transfer transistors M5 to M8 are controlled by the clock signal Ck and the inverse of this signal respectively, as represented in FIG. 3; these signals being applied respectively to the terminals 17 and 18 of the comparators.

On looking at this figure it is appreciated that in both circuits, the nodes 19 and 20 between their transfer transistor M6 and their transistors M2 and M4, are connected respectively to capacitors C3 and C4, of low value, typically a few tens of femtofarads. These capacitors make it possible slightly to modify the potential on the nodes 19 and 20, in the positive direction and in the negative direction respectively, to form the voltages $+V_{th}$ and $-V_{th}$ at the time that the clock pulse Ck or the complement of this pulse is applied to the respective terminals 17 and 18.

This procedure is illustrated in FIG. 5 with regard to the comparator 15. It has the important advantage of avoiding the use of a positive- and negative-threshold voltage generator, the arrangement thus being less bulky and having lower consumption. It should be noted that in FIG. 5, the solid line represents the voltage of the junction point 19 (FIG. 3) at the time at which a transition of the clock signal Ck occurs, the dashed line representing the evolution of the voltage on the node 21.

The outputs from the two comparators 15 and 16 appear on terminals 21 and 22 respectively at the junction between the transistors M1, M3 and M5 and at the node 20. These outputs go off to a transformation circuit 23 intended to produce the values of $b_i$ from signals generated by the comparators 15 and 16 according to the following truth table:

| TRUTH TABLE | | |
|---|---|---|
| Value of $b_i$ | Terminal 21 | Terminal 22 |
| 0 | 0 | 0 |
| −1 | 0 | 1 |
| +1 | 1 | 0 |

The output 24 from the circuit 23 is the value $b_i$ which is applied to a circuit 25 intended to produce the two's complement parallel binary words representing the digital samples of the analogue input signal on the basis of so-called RSD (Redundant Signed Digit) coding. Such a circuit is described in the aforecited article.

Furthermore, the output 24 makes it possible to control the setting of the switches S1 and S2 in the course of the execution of the iterations of the algorithm represented in FIG. 1.

FIG. 4 is a timing chart illustrating the running of a series of successive iterations to obtain a sample of the analogue voltage applied to the converter 4. Each pulse train corresponds to the controlling of the corresponding switch S1 to S9 of FIG. 3. It should be noted that the pulse trains controlling the switches S1 and S2 are represented dashed since the corresponding waveforms depend on the successive values of the ternary bit $b_i$ which are obtained on the output 24.

Each operating cycle begins with an acquisition phase PA (FIG. 4) which is also intended to determine the high-significance bit of the value of the sample ultimately obtained.

This acquisition phase runs over two clock intervals $\phi_{a1}$ and $\phi_{a2}$. The switch S7 is still closed during the interval $\phi_{a1}$ in order to reset the amplifier 11 to zero. During the same interval, the switch S8 is closed, this placing on the capacitor C2 the value of the analogue voltage sample to be converted. The switches S4 and S6 are also closed. The switch S9 is open.

During the interval $\phi_{a2}$, the switches S3 and S5 are closed and the switches S4 and S6 are open, this copying the charge placed hitherto on the capacitor C2, over to the capacitor C1. Simultaneously, one or other of the switches S1 or S2 is closed depending on the high-significance bit, the comparators 15 and 16 being made to toggle during this phase in order to give this result.

The next phase constitutes the first iteration $i_1$ of the algorithm which, like each of the succeeding iteration phases, runs over two clock intervals.

During the first interval $\phi 1$, the charge on the capacitor C1 is transferred to the capacitor C2 by closing the switches S4 and S6, whereas depending on the value of $b_i$, one or other of the switches S1 or S2 is closed. This applies the voltage $V_r$ or the voltage 0 to the reference capacitor Cr. In this way, a voltage made up of twice the voltage $V_x$ plus $-b_i{}^*V_r$ appears on the capacitor C2.

Next, in the course of the second interval $\phi 2$ of this phase i1, the charge on the capacitor C2 is recopied over to the capacitor C1 by closing the switches S3 and S5 and opening the switches S4 and S6.

This procedure is repeated during all the subsequent iterations of a complete cycle until the complete binary word representing the analogue sample is obtained. Another sample will then be extracted and processed in the same way.

FIG. 6 shows a graph illustrating the results which may be obtained by virtue of the invention with regard to the signal/noise ratio. For this purpose, this ratio has been plotted as ordinate as a function of the amplitude of an analogue input signal $V_x$ formed by a sinusoid at 1,000 Hz.

The graph shows three curves numbered from 1 to 3. Curve 1 corresponds to a 14-bit perfect analogue/digital converter in which the multiplication by 2 is perfectly accurate. The curve 2 shows the case of an analogue/digital converter according to the invention in which the multiplicative factor is 1.998, namely an error of 0.2%. Curve 3 corresponds to a converter having the same margin of error, but using a conventional computational algorithm with two decision ranges.

It may therefore be seen that the curve 2, indicative of the invention, practically follows a large part of the ideal curve 1 and deviates therefrom within a range of amplitude, with an offset which, by definition, is of no consequence in the application envisaged, such as that of hearing aids.

FIG. 7 represents the algorithm implemented in the digital/analogue converter 6 of FIG. 2.

FIG. 8 shows a diagram of the means of computation MC-A used in the converter 6. It can be seen that this diagram is very similar to that of the means of computation MC of the analogue/digital converter 4 represented in FIG. 3.

These means of computation MC-A comprise a reference capacitor CR-A connected to two switches S10 and S11 connected respectively to a terminal 26 for applying the reference voltage $V_s$ and to earth. These switches are controlled on the basis of the state of a ternary digital signal formulated from the signal provided by the processing circuit 5 in a transformation circuit 27. The latter operates on the basis of a so-called "CSD" (standing for "Canonical Signed Digit") transformation system known per se. Such a system is described in a paper by J. M. Müller published in the Collection Etudes et Recherches en Informatique and entitled "Arithmétique des ordinateurs: opérateurs et fonctions élémentaires" [Computer arithmetic: operators and elementary functions] (Masson, Paris, 1989).

The capacitor Cr-A is also connected to a capacitor C1-A linked between two nodes 28 and 29. The node 28 is connected to two switches S12 and S13. The switch S12 is connected to the output of an operational amplifier 11-A forming a node 30. The switch S13 is connected to earth. The node 29 is connected to a switch S14 linked to the inverting input of the operational amplifier 11-A, and also to a switch S15 connected moreover to earth. The inverting input of the operational amplifier 11-A is linked to a capacitor C2-A connected moreover to the node 30.

The node 30 is connected to a holding circuit 31 which can be triggered in each cycle of iterations of the computational algorithm by means of a switch S16. This circuit provides, on its output 32, the sequence of samples of the analogue voltage to be obtained.

In the case of FIG. 8, the conversion begins with the least significant bit (see also FIG. 9). In each iteration, a corresponding charge, proportional to $b_i{}^*V_s$ is added to that of the capacitor C2-A. ($b_i=\{-1, 0$ or $+1\}$) and the total charge is divided by 2.

Each iteration runs over two clock intervals $\phi 1$ and $\phi 2$, as in the case of the analogue/digital converter 4. During the first clock interval, the capacitor CR-A is charged to the voltage $V_s$ or else to the voltage 0, and the charge on the capacitor C1-A is brought to zero. During the interval $\phi 2$, the capacitor CR-A is charged to the voltage $V_s$ if $b_i=-1$, otherwise to the voltage 0, and the capacitor C1-A is placed in parallel with the capacitor C2-A.

Thus, at the end of each interval $\phi 2$, the voltage on the capacitor C2-A will be:

$$V_{C2-A_{(i+1)}} = \frac{V_{C2-A_{(i)}} + b_i V_s}{2}$$

wherein $V_{C2-A_{(i)}}$ and $V_{C2-A_{(i+1)}}$ are respectively the voltages $V_{y_{(i)}}$ and $V_{y_{(i+1)}}$ as mentioned previously.

At the end of a cycle of iterations, this total voltage is retained in the holding circuit 31 until the arrival of the result of the next cycle of iterations.

With regard to the means of computation MC-A just described, the same properties as those attaching to the means of computation of FIG. 3, namely noteworthy simplicity, may be observed.

What is claimed is:

1. A converter for converting an input signal into an output signal representing said input signal with a relative precision, the converter implementing a conversion algorithm with three decision ranges involving ternary digital values $b_i$ with $b_i=1$, 0, or $-1$, and comprising a single unipolar reference voltage source, means of computation for, in the course of each of the iterations of a sequence of successive iterations of said algorithm, determining a voltage value formed by the sum of a value determined on the basis of the voltage computed in the previous iteration and of a value which is the product of the ternary value obtained in the course of the previous iteration and of said reference voltage, said means of computation comprising for this purpose a unilateral arrangement of a plurality of switched capacitances and a single operational amplifier cooperating with said switched capacitors for delivering said voltage value in each of the said iterations, said converter also comprising generator means for producing, from the successive voltage values computed during said sequence of iterations, successive samples representing, in converted form, said input signal, one of the inputs of said operational amplifier being connected to a fixed potential, said reference source providing a single unipolar reference voltage referenced to said fixed potential.

2. The converter according to claim 1, in which the said input signals are analogue and the said output signals are digital, said means of computation performing, in the course of each of the said iterations, the algorithm of the form $$V_{x(i+1)} = 2V_{x(i)} - b_i V_r$$

in which $V_{x(i)}$ is the voltage obtained in the course of the previous iteration i, $V_{x(i+1)}$ is the voltage to be obtained in the course of the iteration i+1 in progress, $b_i$ is the computed ternary value −1, 0 or +1 and $V_r$ is the reference voltage, said converter further comprising comparison means for comparing the output signal from the said operational amplifier with a bipolar reference voltage and a transformation logic circuit for transforming the output from the said comparison means into the ternary values used in each iteration.

3. The converter according to claim 1, in which the said input signals are digital and the said output signals are analogue, said means of computation performing, in the course of each of the said iterations, the algorithm of the form $$V_{x(i+1)} = \frac{(V_{x(i)} + b_i V_r)}{2}$$

in which $V_{x(i)}$ is the intermediate voltage portion computed in the course of the previous iteration i, $V_{x(i+1)}$ is the intermediate voltage portion to be obtained during the iteration i+1 in progress, $b_i$ is the computed ternary value −1, 0 or +1 and $V_r$ is the reference voltage, said converter further comprising holding means for retaining the cumulated voltage obtained in the course of a cycle of previous iterations during the execution of a cycle of iterations until the latter is completed so as to deliver the successive samples of the analogue voltage to be obtained.

4. Converter according to any one of claims 1 to 3, wherein the non-inverting input of the said operational amplifier is connected to earth.

5. A device for the digital processing of an analogue input signal required to be restored in the form of an analogue output signal comprising:

a first converter comprising an analog input to which said analogue input signal is applied and a first digital output, a digital processing unit having a first digital input connected to said first digital output of said first converter and a second digital output, and a second converter comprising a second digital input connected to said second digital output of said digital processing circuit and an analogue output for delivering said analogue output signal, said first converter implementing a first conversion algorithm with three decision ranges involving ternary digital values $b_i$ with $b_i$=1, 0, or −1, and comprising a first unipolar reference voltage source for generating a first reference voltage, first computation means for, in the course of each of the iterations of a first sequence of successive iterations of said first algorithm, determining a first voltage value formed by the sum of a value determined on the basis of the voltage computed in the previous iteration of said first algorithm and of a value which is the product of the ternary value obtained in the course of the previous iteration of said first algorithm and of said first reference voltage, said first computation means comprising a first plurality of switched capacitances and a first single operational amplifier cooperating with said first plurality of switched capacitors for delivering said first voltage value in each of the said iterations of said first algorithm, said first converter also comprising:

first generator means for producing, from the successive values of said first voltage value computed during said sequence of iterations of said first algorithm, successive first samples representing, a converted form of said analogue input signal as represented by said first digital output, said first plurality of switched capacitances of said first computation means being connected in a unilateral arrangement in combination with said first single operational amplifier, one of the inputs of the said first operational amplifier being connected to a first fixed potential, and said first reference source providing said first unipolar reference voltage referenced to the said first fixed potential;

said second converter implementing a second conversion algorithm with three decision ranges involving ternary digital values bi with $b_i$=1, 0, or −1, and comprising a second reference voltage source for generating a second reference voltage, second computation means for, in the course of each of the iterations of a second sequence of successive iterations of the said second algorithm, determining a second voltage value formed by the sum of a value determined on the basis of the voltage computed in the previous iteration of said second algorithm and of a value which is the product of the ternary value obtained in the course of the previous iteration of said second algorithm and of the said second reference voltage, said second computation means comprising a second plurality of switched capacitances and a second single operational amplifier cooperating with said second plurality of operational amplifiers for delivering said second voltage value in each of the said iterations of said second algorithm, said second converter also comprising:

second generator means for producing, from the successive values of said second voltage value computed during the said second sequence of iterations of said second algorithm, successive second samples representing, a converted form of said second digital input as represented by said first digital output, said second plurality of switched capacitances of said second computation means being connected in an unilateral arrangement in combination with said second single operational amplifier, one of the inputs of the said second operational amplifier being connected to a second fixed potential, and said second reference source providing said second unipolar reference voltage referenced to the said second fixed potential.

6. Device according to claim 5, constituting a hearing aid, wherein said analog input signal is a sound signal and said processing circuit is so arranged as to adapt said sound signal as represented by said first digital output to physiological properties of a patient.

7. Device according to claim 5, wherein said first algorithm performed in the course of each of the said first iterations, by said first computation means has the form $$V_{x(i+1)} = 2V_{x(i)} - b_i V_r$$

in which $V_{x(i)}$ is the voltage obtained in the course of the previous iteration i, $V_{x(i+1)}$ is the voltage to be obtained in the course of the iteration i+1 in progress, $b_i$ is the computed ternary value −1, 0 or +1 and $V_r$ is the first reference voltage, said first converter further comprising comparison means for comparing the output signal from the said first operational amplifier with a bipolar reference voltage and a transformation logic circuit for transforming the output from the said comparison means into the ternary values.

8. A device as claimed in claim 5, wherein said second computation means perform, in the course of each of the said iterations, said second algorithm of the form $$V_{y(i+1)} = \frac{(V_{y(i)} + b_i V_s)}{2}$$

in which $V_{y(i)}$ is the intermediate voltage portion computed in the course of the previous iteration i, $V_{y(i+1)}$ is the intermediate voltage portion to be obtained during the iteration i+1 in progress, $b_i$ is the computed ternary value −1, 0 or +1 and $V_s$ is the second reference voltage, said second converter further comprising holding means for retaining the cumulated voltage obtained in the course of a cycle of previous iterations during the execution of a cycle of iterations until the latter is completed so as to deliver the successive samples of said analogue output signal to be obtained.

9. A converter for converting an input signal into an output signal representing said input signal with a relative precision, the converter implementing a conversion algorithm with three decision ranges involving ternary digital values $b_i$ with $b_i$=1, 0, or −1, and comprising a unipolar reference voltage source, means of computation for, in the course of each of the iterations of a sequence of successive iterations of said algorithm, determining a voltage value formed by the sum of a value determined on the basis of the voltage computed in the previous iteration and of a value which is the product of the ternary value obtained in the course of the previous iteration and of said reference voltage, said means of computation comprising for this purpose a unilateral arrangement of a plurality of switched capacitances and a single operational amplifier cooperating with said switched capacitors for delivering said voltage value in each of said iterations, said converter also comprising generator means for producing, from the successive voltage values computed during said sequence of iterations, successive samples representing, in converted form, said input signal, one of the inputs of said operational amplifier being connected to a fixed potential, said reference source providing a unipolar reference voltage referenced to said fixed potential, wherein said generator means comprise two comparators, in each of which one of the comparison inputs is connected to a capacitor charged via a control signal triggering the comparison operation in the respective comparator, these capacitors being earthed.

10. A converter for converting an input signal into an output signal representing said input signal with a relative precision, the converter implementing a conversion algorithm with three decision ranges involving ternary digital values $b_i$ with $b_i$=1, 0, or −1, and comprising a unipolar reference voltage source, means of computation for, in the course of each of the iterations of a sequence of successive iterations of said algorithm, determining a voltage value formed by the sum of a value determined on the basis of the voltage computed in the previous iteration and of a value which is the product of the ternary value obtained in the course of the previous iteration and of said reference voltage, said means of computation comprising for this purpose a unilateral arrangement of a plurality of switched capacitances and a single operational amplifier cooperating with said switched capacitors for delivering said voltage value in each of said iterations, said converter also comprising generator means for producing, from the successive voltage values computed during said sequence of iterations, successive samples representing, in converted form, said input signal, one of the inputs of said operational amplifier being connected to a fixed potential, said reference source providing a unipolar reference voltage referenced to said fixed potential, wherein the non-inverting input of said operational amplifier is connected to earth, and said generator means includes two comparators, in each of which one of the comparison inputs is connected to a capacitor charged via a control signal triggering the comparison operation in the respective comparator, these capacitors being earthed.

* * * * *